(12) United States Patent
Shiozawa et al.

(10) Patent No.: US 6,518,635 B1
(45) Date of Patent: Feb. 11, 2003

(54) SEMICONDUCTOR DEVICE AND MANUFACTURING METHOD THEREOF

(75) Inventors: Katsuomi Shiozawa, Hyogo (JP); Toshiyuki Oishi, Hyogo (JP); Yuji Abe, Hyogo (JP); Yasunori Tokuda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/610,862

(22) Filed: Jul. 6, 2000

(30) Foreign Application Priority Data

Jan. 12, 2000 (JP) .......................... 2000-003379

(51) Int. Cl.7 ..................... H01L 27/108; H01L 29/82; H01L 29/00
(52) U.S. Cl. ................ 257/410; 257/647; 257/648; 257/652; 257/635; 257/510; 257/513; 257/519; 257/397; 257/410; 257/295; 257/411; 257/310; 257/324; 257/325; 257/405
(58) Field of Search ................... 257/647, 648, 257/652, 635, 513, 510, 519, 397, 410, 295, 411, 310, 324, 325, 405, 535

(56) References Cited

U.S. PATENT DOCUMENTS 5,554,876 A * 9/1996 Kusunoki et al. ............ 257/411
5,850,102 A * 12/1998 Matsuno ..................... 257/635
6,084,276 A * 7/2000 Gambino .................... 257/397
6,097,072 A * 8/2000 Omid-Zohoor ............. 257/397
6,191,463 B1 * 2/2001 Mitani et al. ................ 257/411
6,261,920 B1 * 7/2001 Oyamatsu ................... 438/424
6,265,749 B1 * 7/2001 Gardner et al. ............. 257/410
6,278,164 B1 * 8/2001 Hieda et al. ................. 257/410

FOREIGN PATENT DOCUMENTS

| JP | 2-90571 | 3/1990 |
| JP | 402143461 A * | 6/1990 |
| JP | 3-108373 | 5/1991 |
| JP | 406029314 A * | 2/1994 |

OTHER PUBLICATIONS

"Characteristics of CMOS Device Isolation for the ULSI Age", A. Bryant et al., International Electron Device Meeting (IEDM) 94 (1994), 28.1.1–28.1.4, pp. 671–674.

* cited by examiner

Primary Examiner—Eddie Lee
Assistant Examiner—Joseph Nguyen
(74) Attorney, Agent, or Firm—McDermott, Will & Emery

(57) ABSTRACT

A major object of the present invention is to provide an improved semiconductor device so as to be able to reduce gate electric field concentration at a channel edge, suppress decrease in the threshold during MOSFET operation and reduce the leakage current. A gate insulation film is formed on a semiconductor substrate. A gate electrode is formed on the semiconductor substrate with the gate insulation film therebetween. The dielectric constant of the gate insulation film is not uniform in the surface.

18 Claims, 18 Drawing Sheets

SEMICONDUCTOR DEVICE AND MANUFACTURING METHOD THEREOF

BACKGROUND OF THE INVENTION

1. Field of the Invention

The present invention relates generally to semiconductor devices, and more particularly to an improved semiconductor device so as to be able to ease gate electric field concentration at an isolation edge. The present invention also relates to a method of manufacturing such a semiconductor device.

2. Description of the Background Art

FIGS. 48 to 52 show steps of a conventional semiconductor device manufacturing method disclosed in 28. 1. 1 of International Electron Device Meeting (IEDM) 94 (1994).

Referring to FIG. 48, a pattern of a thermal oxide film 101 and a silicon nitride film 102 is formed on a silicon substrate 100. A portion without the pattern is intended to isolate electric field transistors (MOSFETs) (active elements). The opening portion (isolation portion) is formed such as by photolithography and dry etching. In other words, the pattern is removed at a portion for forming an isolation region and is left at a portion for forming an electronic element. By using the pattern of silicon nitride film 102, silicon substrate 100 is selectively etched to form a trench 103 at a portion to be an isolation region.

Referring to FIG. 49, a thermal oxide film 104 is formed on an inner wall of trench 103 by thermal oxidation. Thermal oxidation film 104 is formed since silicon on the surface of trench 103 becomes an oxide film through oxidation. Thereafter, trench 103 is filled with an oxide film 105 (tetraethoxysilane (TEOS) or high density plasma (HDP)—CVD, for example).

Referring to FIG. 50, a planarization method (such as etching and chemical mechanical polishing) is used to reduce the thickness of oxide film 105 toward the substrate by using silicon nitride film 102 as a stopper so as to planarize the surface of the semiconductor device. Silicon nitride film 102 which is exposed by planarization is removed. Finally, oxide film 101 is removed by wet etching.

Referring to FIG. 51, a gate insulation film 107 is formed on silicon substrate 100. In this case, gate insulation film 107 is formed by thermal oxidation so that the dielectric constant in the channel direction becomes uniform.

Referring to FIG. 52, a gate electrode material layer 108 is formed on silicon substrate 100 to complete a gate electrode of the transistor.

In the following, problems with the conventional art will be described.

FIG. 53 is an enlarged view of a portion encircled in FIG. 51. In trench isolation provided by the conventional method, a depression 109 is formed at an isolation edge. If gate electrode 108 is formed in this state, the gate electrode is also formed in depression 109. Since the gate electric field influences portion 109 from two directions of A, B in the figure, the electric field becomes stronger at portion 109 than the channel central portion.

Considering transistor operation, the entire channel should start operation simultaneously. However, a transistor having such a structure starts its operation from a portion with a stronger gate electric field, which results in irregular transistor operation. Since this results in decrease in a threshold voltage and increase in leakage current during MOSFET operation, it becomes a reason for the deteriorated MOSFET properties. Even if there is not any depression, such deterioration of the MOSFET properties is caused depending on a manner in which the gate electric field is applied.

SUMMARY OF THE INVENTION

The present invention was made to solve the above described problems, and its object is to provide an improved semiconductor device so as to be able to ease gate electric field concentration at an isolation edge (channel edge).

Another object of the present invention is to provide an improved semiconductor device so as to be able to suppress decrease in a threshold during MOSFET operation.

Still another object of the present invention is to provide an improved semiconductor device so as to be able to reduce leakage current.

The present invention also provides a method of manufacturing such a semiconductor device.

A semiconductor device according to a first aspect includes a semiconductor substrate. A gate insulation film is formed on the semiconductor substrate. A gate electrode is formed on the semiconductor substrate with the gate insulation film therebetween. The dielectric constant of the gate insulation film is not uniform in the surface.

In the semiconductor device according to a second aspect, the dielectric constant of the gate insulation film is not uniform in the channel width direction.

In the semiconductor device according to a third aspect, the dielectric constant of a channel edge, in the channel width direction, of the gate insulation film is made lower than that of a channel central region.

In the semiconductor device according to a fourth aspect, the dielectric constant of the channel central region of the gate insulation film is made higher than 3.9 which is the dielectric constant of an ordinary oxide film.

In the semiconductor device according to a fifth aspect, the channel edge, in the channel width direction, of the gate insulation film includes F or C.

In the semiconductor device according to a sixth aspect, the channel central region of the gate insulation film includes N.

In the semiconductor device according to a seventh aspect, the gate insulation film is formed of $Ta_2O_5$ or $(Ba, Sr)TiO_3$.

In a semiconductor device manufacturing method according to an eighth aspect, a gate insulation film having a lower dielectric constant at its channel edge that at its channel region is formed on a semiconductor substrate.

In the semiconductor device manufacturing method according to a ninth aspect, a first material layer of at least one stacked layer is first formed on a semiconductor substrate. In the first material layer, an opening portion for forming an isolation region is formed. By using the first material layer, in which the opening portion is formed, as a mask, a surface of the semiconductor substrate is etched to form a trench at the surface of the semiconductor substrate. Ions for decreasing the dielectric constant are implanted into a sidewall of the trench. To fill in the trench, a second material layer is formed on the semiconductor substrate. The thickness of the second material layer is reduced toward the substrate till a surface of the first material layer is exposed. The first material layer thus exposed is removed. A gate insulation film is formed on the semiconductor substrate. A gate electrode is formed on the gate insulation film.

In the semiconductor device manufacturing method according to a tenth aspect, a first material layer of at least one stacked layer is first formed on a semiconductor substrate (first step). In the first material layer, an opening portion for forming an isolation region is formed (second step). By using the first material layer, in which the opening portion is formed, as a mask, a surface of the semiconductor substrate is etched to form a trench at the surface of the semiconductor substrate (third step). To fill in the trench, a second material layer is formed on the semiconductor substrate (fourth step). The thickness of the second material layer is reduced toward the substrate till a surface to the first material layer is exposed (fifth step). Ions for decreasing the dielectric constant are implanted into the second material layer filled in the trench (sixth step). The first material layer thus exposed is removed (seventh step). A gate insulation film is formed on the semiconductor substrate (eighth step). A gate electrode is formed on the gate insulation film (ninth step).

In the semiconductor device manufacturing method according to an eleventh aspect, the ions are implanted obliquely to the semiconductor substrate in the sixth step of the ninth aspect.

In the semiconductor device manufacturing method according to a twelfth aspect, a first material layer of at least one stacked layer is first formed on a semiconductor substrate. In the first material layer, an opening portion for forming an isolation region is formed. By using the first material layer, in which the opening portion is formed, as a mask, a surface of the semiconductor substrate is etched to form a trench at the surface of the semiconductor substrate. To fill in the trench, a second material layer is formed on the semiconductor substrate. The thickness of the second material layer is reduced toward the substrate till a surface of the first material layer is exposed. The first material layer thus exposed is removed. Ions for increasing the dielectric constant are implanted into the surface of the semiconductor substrate except a portion to be a channel edge. A gate insulation film is formed on the semiconductor substrate. A gate electrode is formed on the gate insulation film.

In the semiconductor device manufacturing method according to a thirteenth aspect, a first material layer of at least one stacked layer is first formed on a semiconductor substrate. In the first material layer, an opening portion for forming an isolation region is formed. By using the first material layer, in which the opening portion is formed, as a mask, a surface of the semiconductor substrate is etched to form a trench at the surface of the semiconductor substrate. To cover an inner wall surface of the trench, an insulation film of a low dielectric constant is formed on the semiconductor substrate. To fill in the trench, a second material layer is formed on the semiconductor substrate. The thickness of the second material layer is reduced toward the substrate till a surface of the first material layer is exposed. The first material layer thus exposed is removed. A gate insulation film is formed on the semiconductor substrate. A gate electrode is formed on the gate insulation film.

In the semiconductor device manufacturing method according to a fourteenth aspect, a first material layer of at least one stacked layer is first formed on a semiconductor substrate. In the first material layer, an opening portion for forming an isolation region is formed. By using the first material layer, in which the opening portion is formed, as a mask, a surface of the semiconductor substrate is etched to form a trench at the surface of the semiconductor substrate. A lower portion of the first material layer exposed due to the trench which in is contact with the surface of the semiconductor substrate is etched horizontally to form a concave portion. To fill in the concave portion and cover an inner wall surface of the trench, an insulation film of a low dielectric constant is formed on the semiconductor substrate. To fill in the trench, a second material layer is formed on the semiconductor substrate. The thickness of the second material layer is reduced toward the substrate till a surface of the first material layer is exposed. The first material layer thus exposed is removed. A gate insulation film is formed on the semiconductor substrate. A gate electrode is formed on the gate insulation film.

In the semiconductor device manufacturing method according to a fifteenth aspect, a first material layer of at least one stacked layer is first formed on a semiconductor substrate. In the first material layer, an Ad; opening portion for forming an isolation region is formed. By using the first material layer, in which the opening portion is formed, as a mask, a surface of the semiconductor substrate is etched to form a trench at the surface of thesemiconductor substrate. A sidewall of the opening portion of the first material layer is further etched horizontally to widen the diameter of the opening portion. Ions for decreasing the dielectric constant are implanted into the surface of the semiconductor substrate. To fill in the trench, a second material layer is formed on the semiconductor substrate. The thickness of the second material layer is reduced toward the substrate till a surface of the first material layer is exposed. The first material layer thus exposed is removed. A gate insulation film is formed on the semiconductor substrate. A gate electrode is formed on the gate insulation film.

In the semiconductor device manufacturing method according to a sixteenth aspect, a first material layer of at least one stacked layer is first formed on a semiconductor substrate. In the first material layer, an opening portion for forming an isolation region is formed. By using the first material layer, in which the opening portion is formed, as a mask, a surface of the semiconductor substrate is etched to form a trench at the surface of the semiconductor substrate. To fill in the trench, a second material layer is formed on the semiconductor substrate. The thickness of the second material layer is reduced toward the substrate till a surface of the first material layer is exposed. The first material layer is etched to widen the diameter of the opening portion. Ions for decreasing the dielectric constant are implanted into the surface of the semiconductor substrate. The first material layer thus exposed is removed. A gate insulation film is formed on the semiconductor substrate. A gate electrode is formed on the gate insulation film.

In the semiconductor device manufacturing method according to a seventeenth aspect, F or C is used as the ions for decreasing the dielectric constant.

In the semiconductor device manufacturing method according to an eighteenth aspect, N is used as the ions for increasing the dielectric constant.

In the semiconductor device manufacturing method according to a nineteenth aspect, a low dielectric constant film including F, C is used as the film for decreasing the dielectric constant.

The semiconductor device manufacturing method according to a twentieth aspect further includes the step of forming an isolation film on the inner wall of the trench after formation of the trench and before ion implantation in the eighth aspect, and the ion implantation is carried out through the isolation film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described with reference to the drawings.

Figure 1:
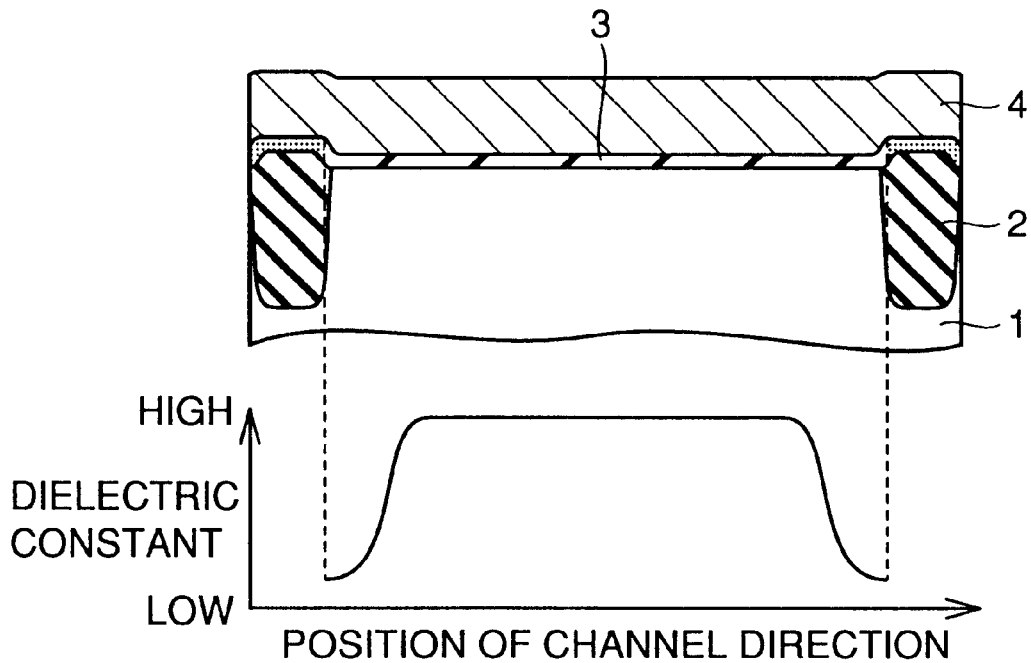
FIG. 1 is a sectional view of a semiconductor device according to an embodiment.

FIG. 1 is a sectional view of a semiconductor device according to an embodiment.

In a surface of a silicon substrate 1, a trench isolation 2 is formed. On silicon substrate 1, a gate insulation film 3 of non-uniform dielectric constants is formed. A gate electrode 4 is formed on gate insulation film 3. The dielectric constant of a channel edge, in the channel width direction, of gate insulation film 3 is made lower than that of a channel central region.

Figure 2:
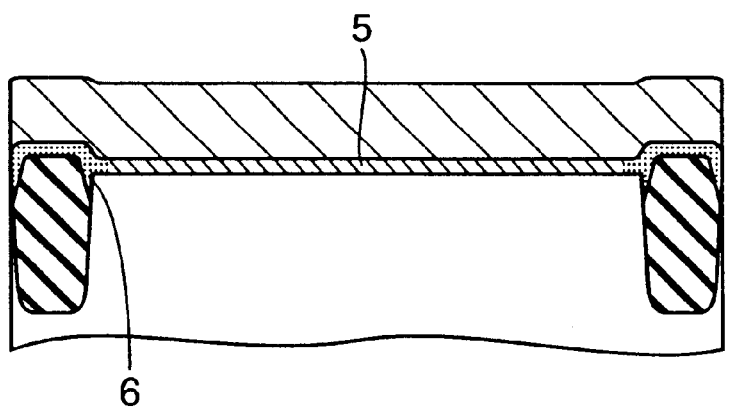
FIG. 2 is a sectional view of a semiconductor device according to another embodiment.

The semiconductor device shown in FIG. 2 is a sectional view of a semiconductor device according to another embodiment of the present invention. In the figure, the portion denoted by reference numeral 6 of the gate insulation film represents a portion having a dielectric constant made lower by implantation of ions for decreasing the dielectric constant, and the portion denoted by reference numeral 5 represents a portion having a dielectric constant made relatively high as a result.

Figure 3:
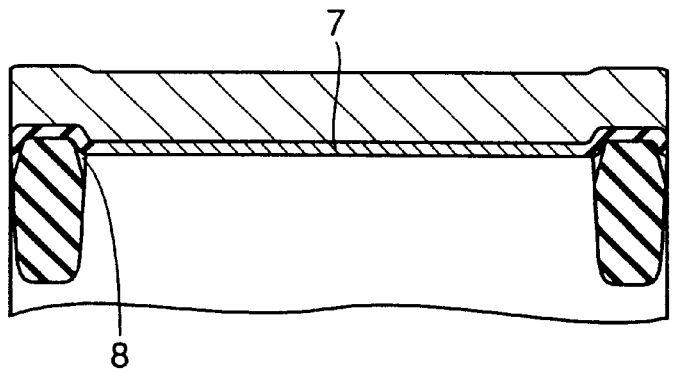
FIG. 3 is a sectional view of a semiconductor device according to still another embodiment.

FIG. 3 is a sectional view of a semiconductor device according to still another embodiment of the present invention. In the figure, reference numeral 7 represents a portion of the gate insulation film which has a dielectric constant made higher by implantation of ions for increasing the dielectric constant, and reference numeral 8 represents a portion which has a dielectric constant made relatively low as a result.

Figure 4:
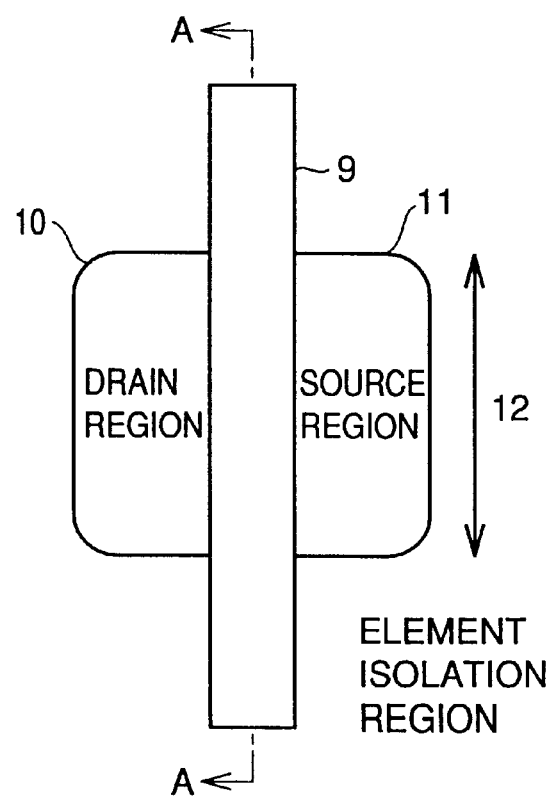
FIG. 4 is a plan view of the semiconductor device according to the embodiment.

FIG. 4 is a plan view of the semiconductor device according to the present invention. On both sides of a gate electrode 9, a source region 11 and a drain region 10 are arranged. Source region 11 and drain region 10 are inserted between element isolation regions. Reference numeral 12 denotes the channel width direction. FIGS. 1 to 3 are all sectional views along line A—A in FIG. 4.

In the following, the examples of the present invention will be described with reference to the drawings.

FIRST EXAMPLE

Figure 5:
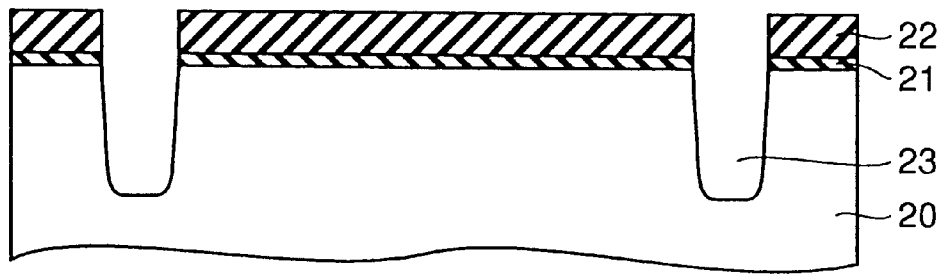
FIGS. 5 to 10 are sectional views of a semiconductor device in first to sixth steps of a semiconductor device manufacturing method according to a first example.

Referring to FIG. 5, a pattern of a thermal oxide film 21 and a silicon nitride film 22 is formed on a silicon substrate 20. A portion without the pattern is intended to isolate MOSFETs (active elements). The opening portion (isolation portion) is formed such as by phototolithography and dry etching. In other words, the pattern is removed at a portion for forming an isolation region and is left at a portion for forming an electronic element. The film thickness of thermal oxide film 21 and silicon nitride film 22 is sufficient if they are not disappeared by subsequent processes (such as trench formation and planarization). The film thickness is approximately 100 nm or more in total.

The extension of the opening portion (isolation width on a mask) depends on a circuit type. It may be from 0.1 $\mu$m to several hundreds Km in the same wafer. Then, by using silicon nitride film 22 as a mask, silicon substrate 20 is selectively etched to form a trench 23. The depth of trench 23 depends on selection of the minimum isolation width and is approximately 0.3 $\mu$m or less in an integrated circuit of 0.14 $\mu$m or less.

Figure 6:
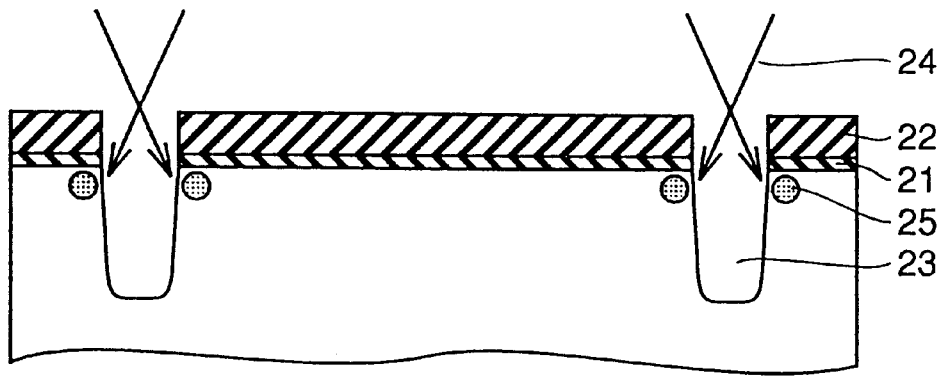

A process as a major point of the present invention follows. Referring to FIG. 6, ions 24 for decreasing the dielectric constant of an insulation film are implanted into a sidewall trench 23 to form an implanted region 25. The ions are preferably fluorine (F) or carbon (C). The subsequent processes are the same as the conventional art.

Figure 7:
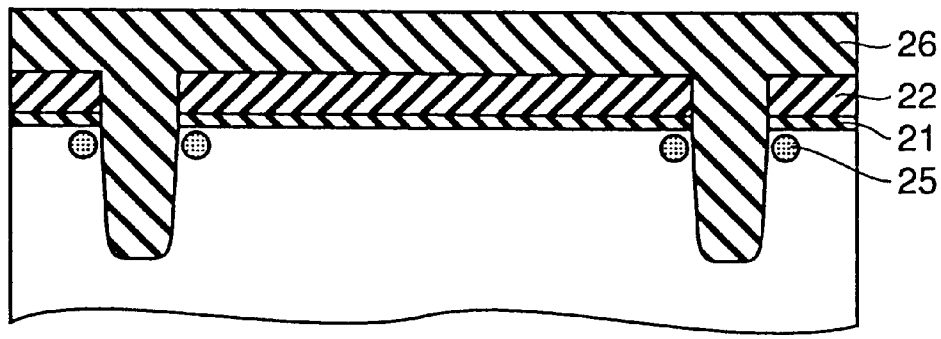

In other words, referring to FIG. 7, trench 23 is filled with an oxide film 26 (TEOS or HDP-CVD, for example).

Figure 8:
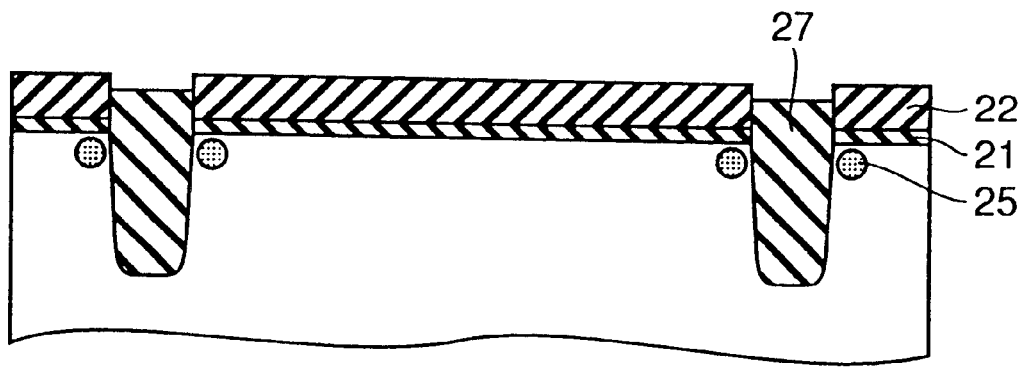

Referring to FIGS. 7 and 8, a planarization method (such as etching and chemical mechanical polishing) is used to reduce the thickness of oxide film 26 toward the substrate by using silicon nitride film 22 as a stopper till the surface of silicon nitride film 22 is exposed. Silicon nitride film 22 exposed by planarization is removed. Oxide film 21 is also removed.

Figure 9:
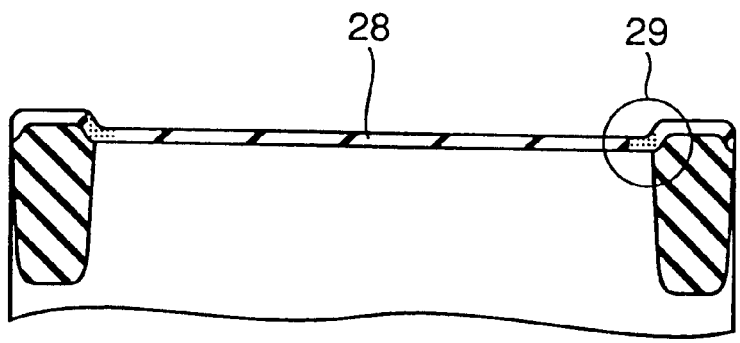

Referring to FIG. 9, a gate oxide film 28 is formed. Gate insulation film 28 may be formed of $Ta_2O_5$, (BA, Sr) $TiO_3$. This also applies to the examples below. At this time, gate insulation film 29 at a channel edge becomes a gate oxide film with a lower dielectric constant than a channel central portion because of ions 24 previously implanted into implanted region 25.

Figure 10:
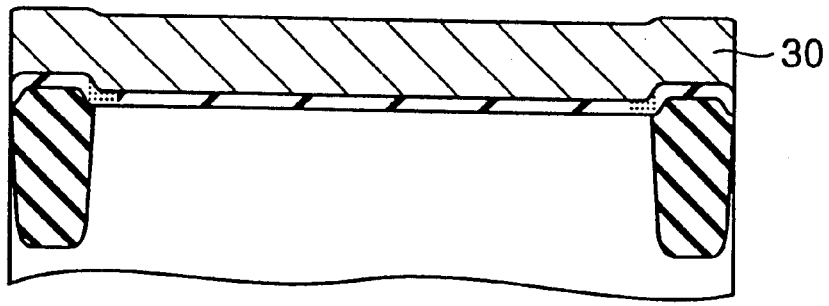

Referring to FIG. 10, a gate electrode 30 is formed on gate insulation film 28, thereby completing a gate structure.

In the processes up to this point, the process of removing oxide film 21 by wet etching, the process of forming the oxide film for ion implantation and the process of forming the gate oxide film make the insulation film of the isolation region above the substrate thinner. However, ions 24, having the effect of decreasing the dielectric constant, previously implanted during gate oxide film formation cause the dielectric constant of the oxide film at the isolation edge to be lower than that of the channel central portion. Thus, even if the channel edge is depressed, the electric field at the isolation edge (channel edge) becomes lower than the channel central portion, which eases electric field concentration at the isolation edge. It can prevent decrease in the threshold and increase in the leakage current of an MOSFET and can realize superior transistor properties.

In the example, implantation into the trench sidewall is directly carried out against the silicon substrate as an example with reference to FIG. 6. However, the present invention is not limited to this case. If an insulation film, for example an oxide film previously covers the inner wall of the trench prior to implantation and ion implantation is carried out through the isolation film, damages by implantation can be reduced, and therefore junction leakage or the like can be reduced with the same effects as the first embodiment being obtained.

SECOND EXAMPLE

Figure 11:
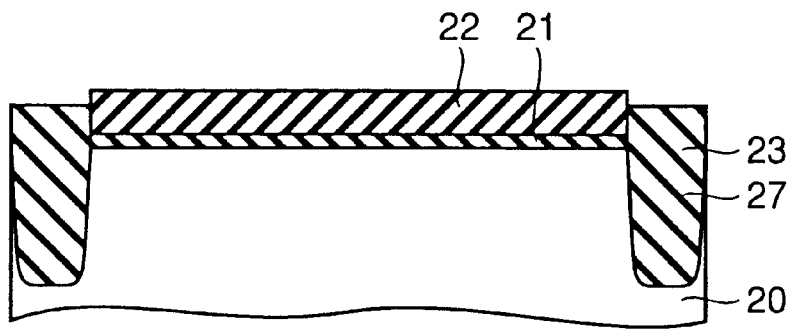
FIGS. 11 to 15 are sectional views of a semiconductor device in first to fifth steps of a semiconductor device manufacturing method according to a second example.

Referring to FIG. 11, a pattern of a thermal oxide film 21 and a silicon nitride film 22 is formed on a silicon substrate 20. A portion without the pattern is intended to isolate MOSFETs (active elements). The opening portion (isolation portion) is formed such as by photolithography and dry etching. In other words, the pattern is removed at a portion for forming an isolation region and is left at a portion for forming an electronic element. The film thickness of thermal oxide film 21 and silicon nitride film 22 is sufficient if they are not disappeared by subsequent processes (such as trench formation and planarization). The film thickness is approximately 100 nm or more in total.

The extension of the opening portion (isolation width on a mask) depends on a circuit type. It may be from 0.1 $\mu$m to several hundreds $\mu$m in the same wafer. Then, by using silicon nitride film 22 as a mask, silicon substrate 20 is selectively etched to form a trench 23. The depth of trench 23 depends on selection of the minimum separation width and is approximately 0.3 $\mu$m or less in a small integrated circuit of 0.14 $\mu$m or less.

Then, an oxide film 27 (TEOS or HDP-CVD, for example) 27 is used to fill in trench 23. Using silicon nitride film 22 as a stopper, the thickness of oxide film 27 is reduced toward the substrate by a planarization method (such as etching and chemical mechanical polishing) till the surface of the silicon nitride film 22 is exposed. Thus, the surface of the semiconductor device is planarized.

The process as a major point of the present invention follows. In other words, referring to FIG. 12, ions 31 (fluorine or carbon, for example) for decreasing the dielectric constant of an isolation film are implanted almost orthogonally into oxide film 27 filled in the trench. The implantation position is such that ions 31 arrive near the surface of silicon substrate 20. It is desirable at this time to previously form a step between oxide film 27 filled in trench 23 and silicon nitride film 22. The step at this time desirably has such a shape that oxide film 27 is lower than silicon nitride film 22. A band 32 is where the largest amount of ions is implanted, and ion implantation is also carried out against a portion on band 32.

Figure 12:
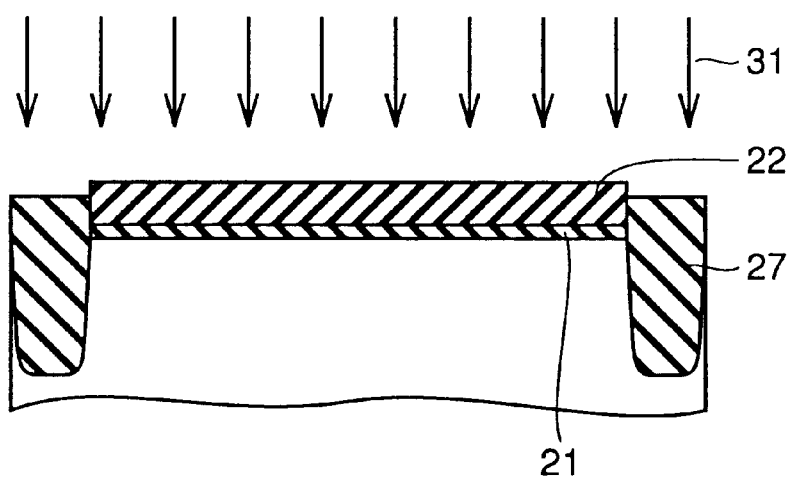
Figure 13:

Referring to FIGS. 12 and 13, silicon nitride film 22 exposed by planarization is removed. Furthermore, oxide film 21 is removed by wet etching.

Figure 14:
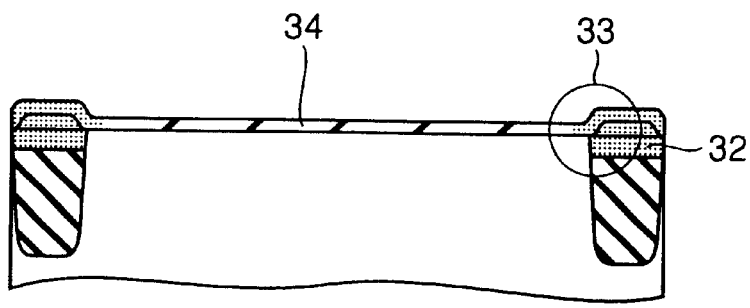

Referring to FIG. 14, a gate insulation film 34 is formed at the surface of silicon substrate 20. At this time, ions 31 in an implanted region 32 are introduced to a gate insulation film 33 at a channel edge. Therefore, the dielectric constant of gate insulation film 33 becomes lower than that of gate insulation film 34. At this time, a large amount of ions 31 is introduced to the gate insulation film (corner portion) which is in contact with band 32, and ions 31 are more or less introduced even to the gate insulation film which is in contact with a portion on band 32.

Figure 15:
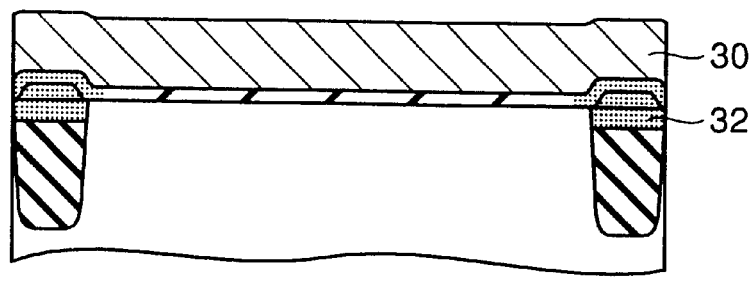

Referring to FIG. 15, a gate electrode 30 is formed thereafter to complete a gate structure.

Because of ions 31, having the effect of decreasing the dielectric constant, previously implanted during gate oxide film formation, the dielectric constant of the gate oxide film at the isolation edge becomes lower than that of the channel central portion. Thus, the electric field at the isolation edge (channel edge) becomes lower as compared with the channel central region, which eases electric field concentration at the isolation edge. It can prevent decrease in the threshold and increase in the leakage current of an MOSFET and can realize superior transistor property.

Figure 16:
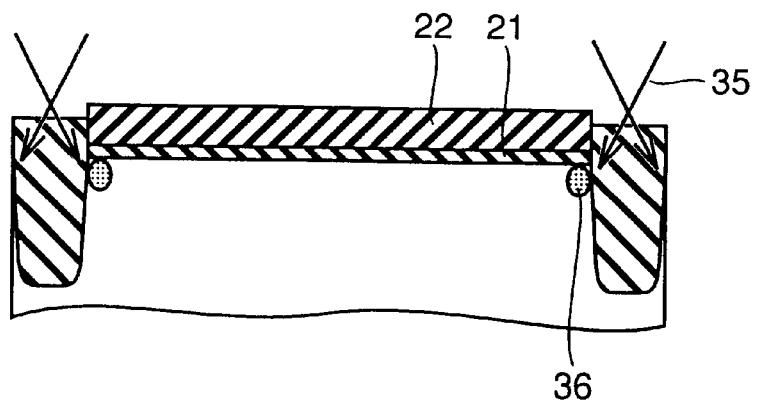
FIGS. 16 and 17 are sectional views of a semiconductor device in first and second steps of a semiconductor device manufacturing method according to a variation of the second example.
Figure 17:
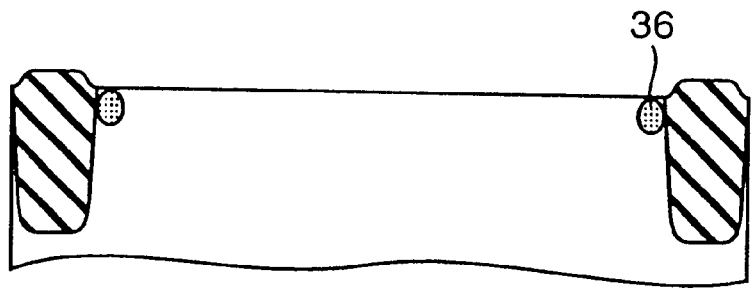

In this example, the ions for decreasing the dielectric constant are implanted orthogonally to the substrate as an example. However, the ions may be implanted obliquely in the vicinity of an interface between the mask and the substrate to form an implanted region 36 as shown in FIGS. 16 and 17. By implantation in this manner, ions 35 can be introduced efficiently into the gate oxide film. It is noted that FIG. 16 corresponds to the process in FIG. 12 and FIG. 17 corresponds to the process in FIG. 13.

THIRD EXAMPLE

Figure 18:
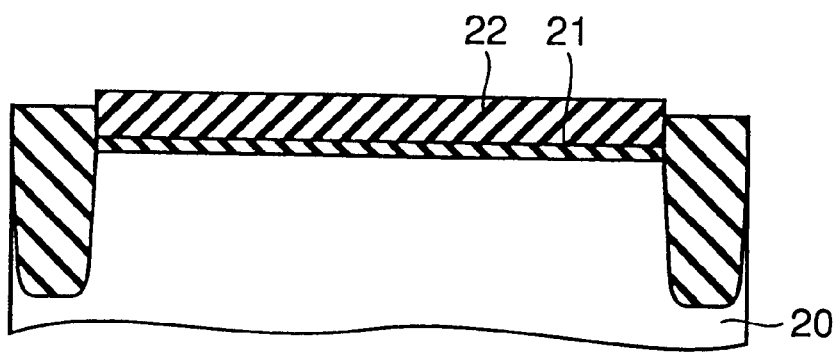
FIGS. 18 to 22 are sectional views of a semiconductor device in first to fifth steps of a semiconductor device manufacturing method according to a third example.

Referring to FIG. 18, the processes prior to isolation region formation are similar to the conventional art. The processes after the following process are points of the present invention.

Figure 19:
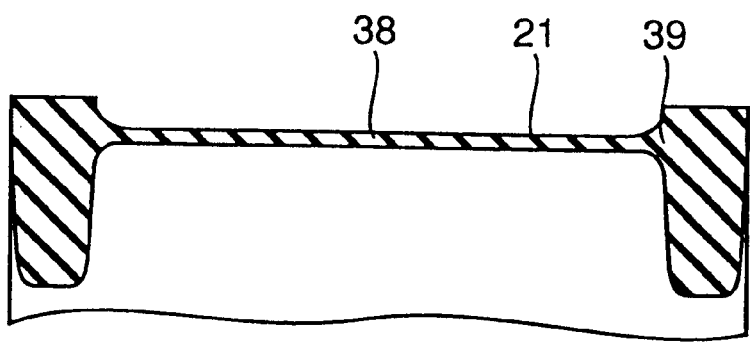

Referring to FIGS. 18 and 19, oxide film 21 observed after silicon nitride film 22 is removed has such a shape that the film thickness is larger at an isolation edge 39 (channel edge) than at a channel central portion 38.

Figure 20:
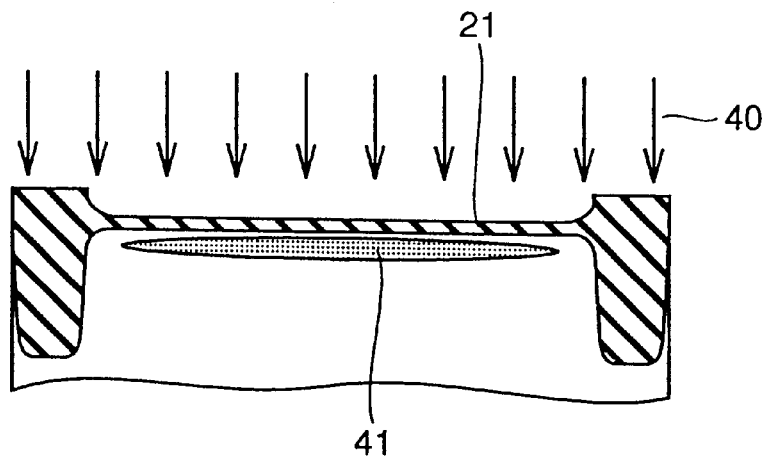

Referring to FIGS. 19 and 20, ions (nitrogen, for example) 40 for increasing the dielectric constant of an isolation film are implanted in this state into the surface of silicon substrate 20 to form an implanted region 41. The implantation position is such that the ions arrive in the vicinity of the surface of silicon substrate 20 and the ions are not implanted into silicon substrate 20 at the isolation edge (channel edge).

Figure 21:
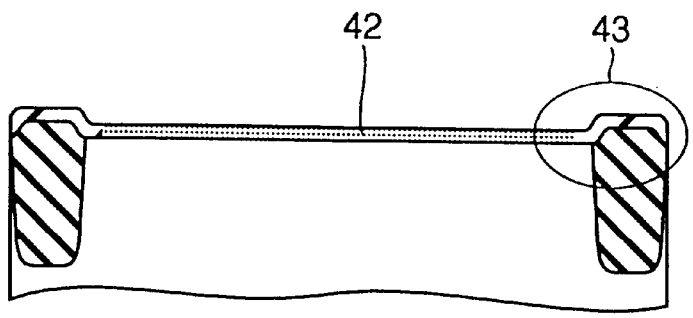
Figure 22:
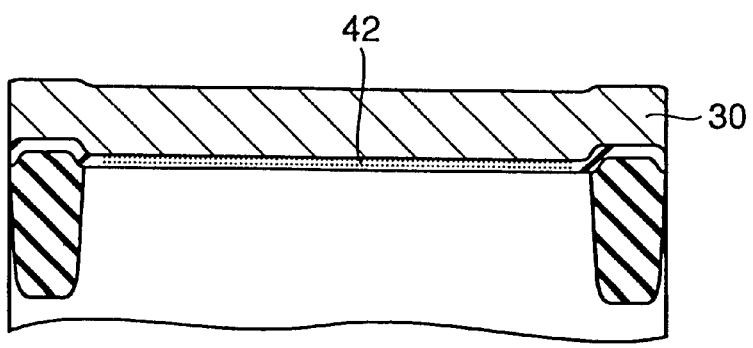

Referring to FIGS. 20 and 21, oxide film 21 is removed and a gate insulation film 42 is formed. At this time, because of ions 40 in implanted region 41, the dielectric constant of gate insulation film 42 at the channel central portion becomes higher than that of gate insulation film 43 at the channel edge. Thus, the electric field at the isolation edge (channel edge) becomes lower as compared with the channel central portion, which eases electric field concentration at the isolation edge. It can prevent decrease in the threshold and increase in the leakage current of an MOSFET and can realize superior transistor properties. Referring to FIG. 22, a gate electrode is formed thereafter thereby completing the gate formation process. Therefore, decrease in the threshold and increase in the leakage current of an MOSFET can be prevented and superior transistor properties can be realized.

FOURTH EXAMPLE

Figure 23:
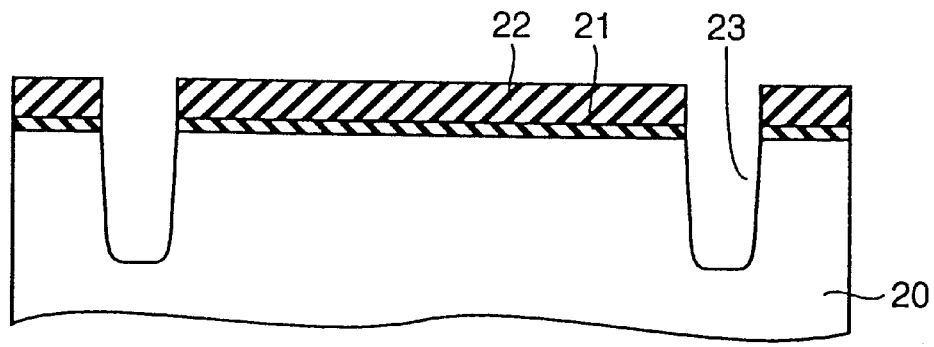
FIGS. 23 to 28 are sectional views of a semiconductor device in first to sixth steps of a semiconductor device manufacturing method according to a first example.

Referring to FIG. 23, a pattern of a thermal oxide film 21 and a silicon nitride film 22 is formed on a silicon substrate 20 similarly to conventional examples. A portion without the pattern is intended to isolate MOSFETs (active elements). The opening portion (isolation portion) is formed such as by photolithography and dry etching. In other words, the pattern is removed at a portion for forming an isolation region and is left at a portion for forming an electronic element. The film thickness of thermal oxide film 21 and silicon nitride film 22 is sufficient if they are not in disappeared by subsequent processes (such as trench formation and planarization). The film thickness is approximately 100 nm or more in total. The extension of the opening portion (separation width on a mask) depends on a circuit type.

It may be from 0.1 µm to several hundreds µm in the same wafer. Then, by using silicon nitride film 22 as a mask, silicon substrate 20 is selectively etched to form a trench 23. The depth of trench 23 depends on selection of the minimum separation width and is approximately 0.3 µm or less in a small integrated circuit of 0.14 µm or less.

The process as a point of the present invention follows.

Figure 24:
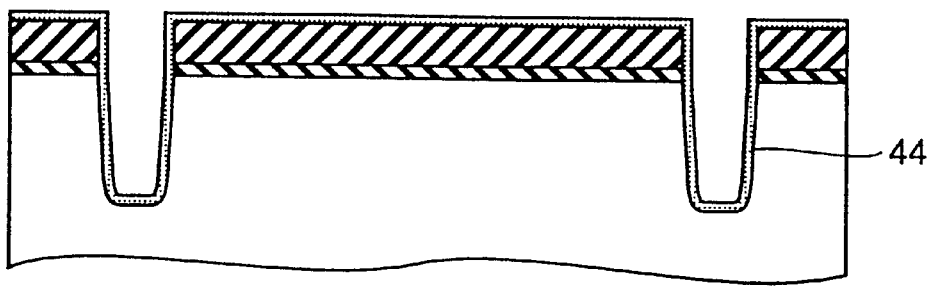

Referring to FIG. 24, an isolation film 44 of a low dielectric constant including fluorine and carbon, for example, is deposited on an inner wall of trench 23. The following processes are similar to conventional examples.

Figure 25:
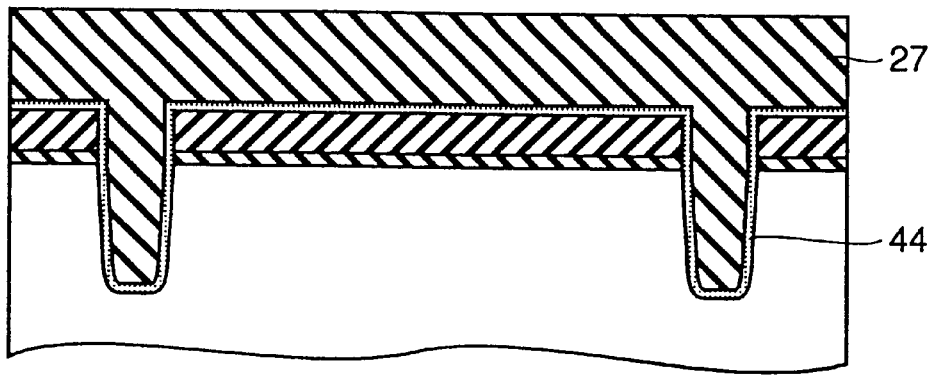

Referring to FIG. 25, an oxide film 27 (TEOS or HDP-CVD, for example) is used to fill in trench 23.

Figure 26:
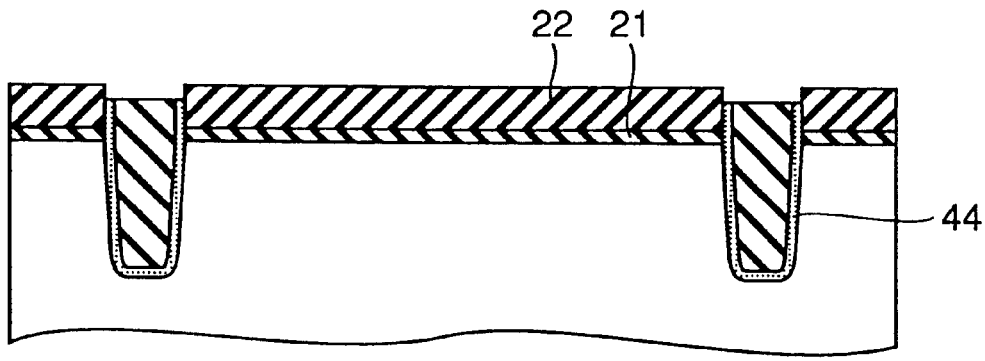

Referring to FIGS. 25 and 26, using silicon nitride film 22 as a stopper, the thickness of oxide film 27 is reduced by a planarization method (such as etching and chemical mechanical polishing) till the surface of silicon nitride film 22 is exposed. Thus, the surface of the semiconductor device is planarized.

Figure 27:
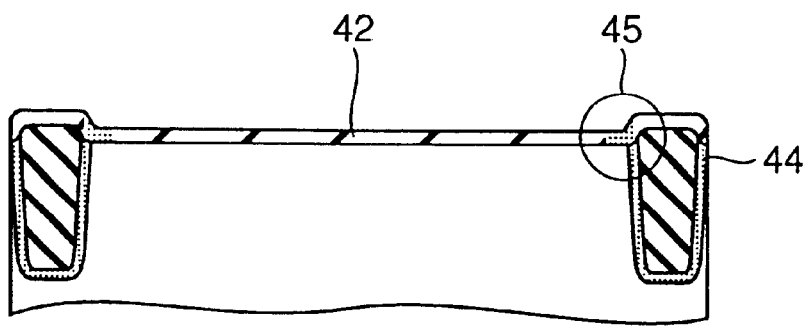

Referring to FIGS. 26 and 27, silicon nitride film 22 exposed by planarization is removed. Furthermore, oxide film 21 is removed by wet etching.

Referring to FIG. 27, a gate insulation film 42 is formed thereafter. At this time, a gate insulation film 45 at a channel edge has a lower dielectric constant due to the effects of lower dielectric constant film 44 filled in trench 23.

Figure 28:
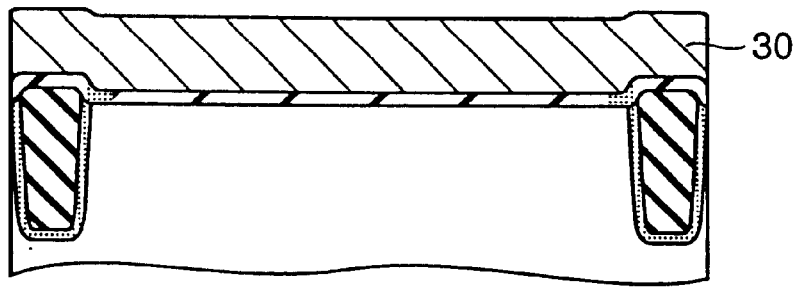

Referring to FIG. 28, a gate electrode 30 is formed thereby completing a gate structure.

Because of low dielectric constant insulation film 44 which is previously formed during gate oxide film formation, the dielectric constant of the oxide film at the isolation edge becomes lower than that of a channel central portion. Thus, the electric field at the isolation edge (channel edge) becomes lower as compared with the channel central portion, which eases electric field concentration at the isolation edge. It can prevent decrease in the threshold and increase in the leakage current of an MOSFET and can realize superior transistor properties.

In this example, the low dielectric constant insulation film is deposited on the trench sidewall as an example. However, the present invention is not limited to the case. If impurities for decreasing the dielectric constant are dispersed from the insulation film to a silicon substrate interface, the insulation film is removed thereafter and a thermal oxide film is formed again on the trench sidewall, then the effects similar to the above example can be attained and the reliability of the oxide film can be improved.

FIFTH EXAMPLE

Figure 29:
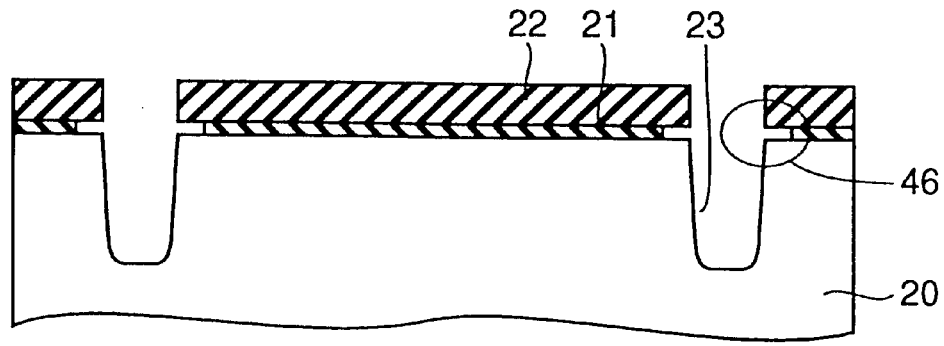
FIGS. 29 to 34 are sectional views of a semiconductor device in first to sixth steps of a semiconductor device manufacturing method according to a fifth example.

Referring to FIG. 29, a pattern of a thermal oxide film 21 and a silicon nitride film 22 is formed on a silicon substrate 20 similarly to the conventional examples. A portion without the pattern is intended to isolate MOSFETs (active elements). The opening portion (isolation portion) is formed such as by photolithography and dry etching. In other words, the pattern is removed at a portion for forming an isolation region and is left at a portion for forming an electronic element. The film thickness of thermal oxide film 21 and silicon nitride film 22 is sufficient if they are not disappeared by subsequent processes (such as trench formation and planarization). The film thickness is approximately 100 nm or more in total. The extension of the opening portion (separation width on a mask) depends on a circuit type. It may be from 0.1 µm to several hundreds µm in the same wafer. Then, by using silicon nitride film 22 as a mask, silicon substrate 20 is selectively etched to form a trench 23. The depth of trench 23 depends on selection of the minimum isolation width and is approximately 0.3 µm or less in a small integrated circuit of 0.14 µm or less.

The next is a process as a point of the present invention. Referring to FIG. 29, silicon oxide film 21 is etched horizontally and its end is receded to form a gap portion 46.

Figure 30:
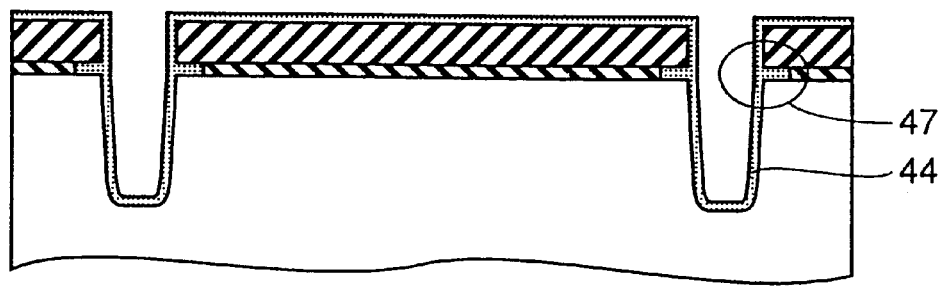

Referring to FIG. 30, an isolation film 44 of a low dielectric constant including fluorine and carbon, for example, is deposited to fill in gap portion 46 and cover an inner wall of trench 23. The subsequent processes are similar to the conventional examples.

Figure 31:
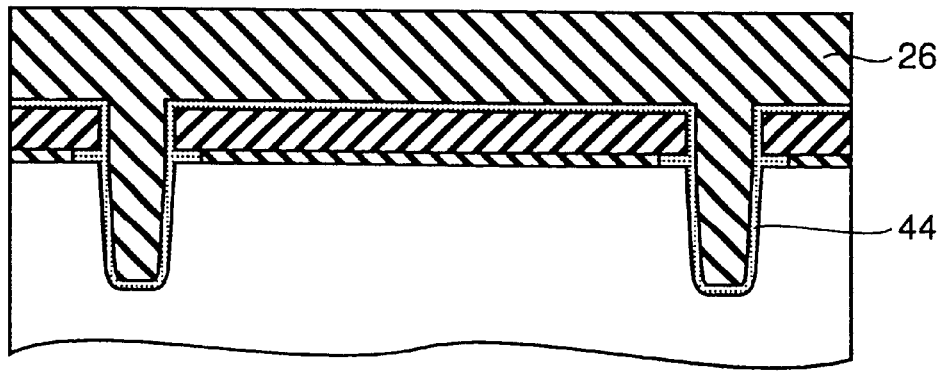

Referring to FIG. 31, an oxide film 26 (TEOS or HDP-CVD, for example) is used to fill in trench 23.

Figure 32:
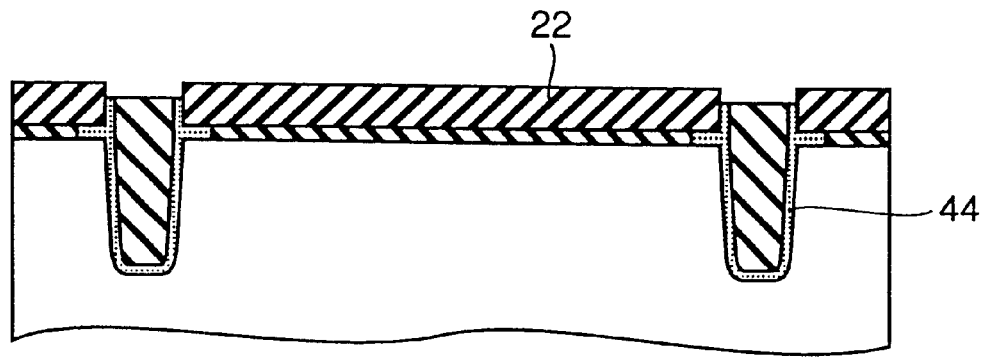

Referring to FIGS. 31 and 32, using trench nitride film 22 as a stopper, the thickness of oxide film 26 is reduced by a planarization method (such as etching and chemical mechanical polishing) till the surface of silicon nitride film 22 is exposed. Thus, the surface of the semiconductor device is planarized. Silicon nitride film 22 exposed by planarization is removed. Furthermore, oxide film 21 is removed by wet etching.

Figure 33:
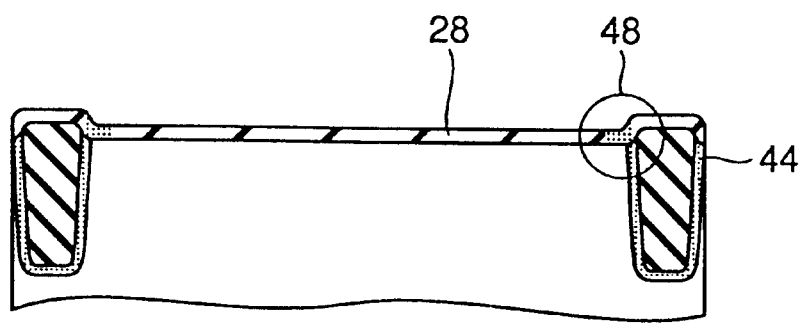

Referring to FIG. 33, a gate insulation film 28 is formed. At a channel edge 48, ions in low dielectric constant film 44 are introduced to form a gate insulation film with a low dielectric constant. Thus, the dielectric constant of the oxide film at the isolation edge becomes lower than that of the channel central portion. Therefore, the electric field at the isolation edge (channel edge) becomes lower as compared with the channel central portion, which eases electric field concentration at the isolation edge.

Figure 34:
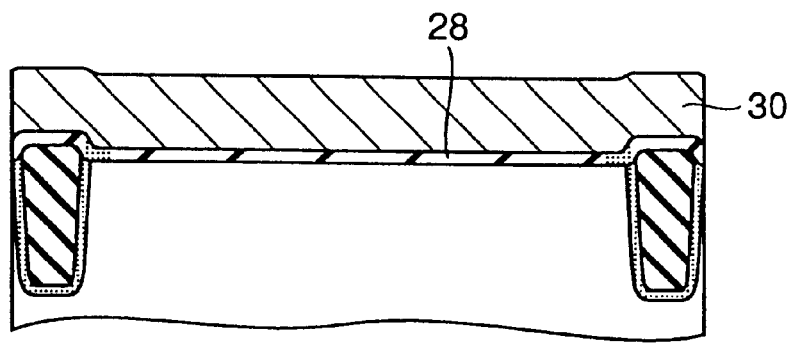

Referring to FIG. 34, a gate electrode 30 is formed on silicon substrate 20. Since the isolation edge is covered with low dielectric constant insulation film 44, the gate electric field can be reduced effectively. It can prevent decrease in the threshold and increase in the leakage current of an MOSFET and can realize superior transistor properties.

SIXTH EXAMPLE

Figure 35:
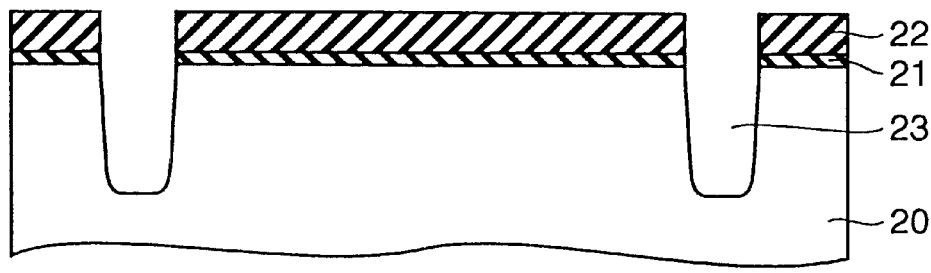
FIGS. 35 to 41 are sectional views of a semiconductor device in first to seventh steps of a semiconductor device manufacturing method according a sixth example.

Referring to FIG. 35, a pattern of a thermal oxide film 21 and a silicon nitride film 22 is formed on a silicon substrate 20 similarly to conventional examples. A portion without pattern is intended to isolate MOSFETs (active elements). The opening portion is formed such as by photolithography and dry etching. In other words, the pattern is removed at a portion for forming an isolation region and is left at a portion for forming an electronic element. The film thickness of thermal oxide film 21 and silicon nitride film 22 is sufficient if they are not disappeared by subsequent processes (such as trench formation and planarization). The film thickness is approximately 100 nm or more in total. The extension of the opening portion (separation width on a mask) depends on a circuit type. It may be from 0.1 µm to several hundreds µm in the same wafer. Then, by using silicon nitride film 22 as a mask, silicon substrate 20 is selectively etched to form a trench 23. The depth of trench 23 depends on selection of the minimum isolation width and is approximately 0.3 μm or less in a small integrated circuit of 0.14 μm or less.

The next is the process as a point of the present invention.

Figure 36:
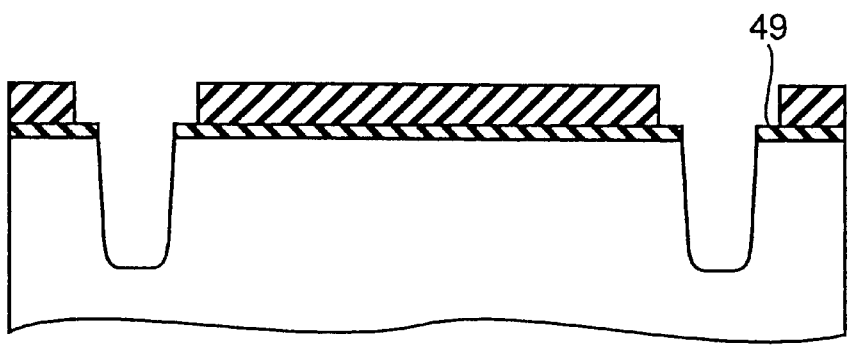

Referring to FIGS. 35 and 36, silicon nitride film 22 is etched, an end of the opening portion is receded horizontally from the end of trench 23, and part 49 of the surface of oxide film 21 is exposed.

Figure 37:
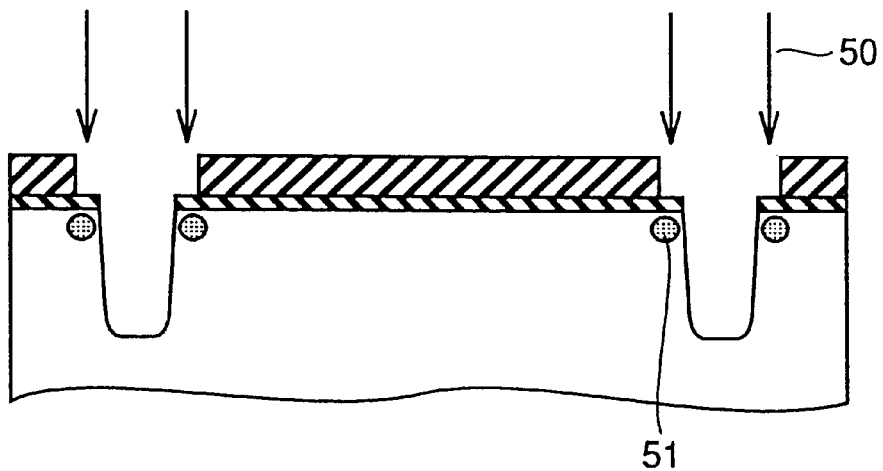

Referring to FIGS. 36 and 37, ions 50 for decreasing the dielectric constant of an isolation film are implanted almost orthogonally into silicon substrate 27 to form an implanted region 51. The implantation position is such that the ions arrive in the vicinity of the surface of silicon substrate 20. Then, implanted region 51 is formed under the exposed region of silicon nitride film 22. Since a region for element formation is covered with silicon nitride film 22 at this time, ion implantation is not carried out in the region.

Figure 38:
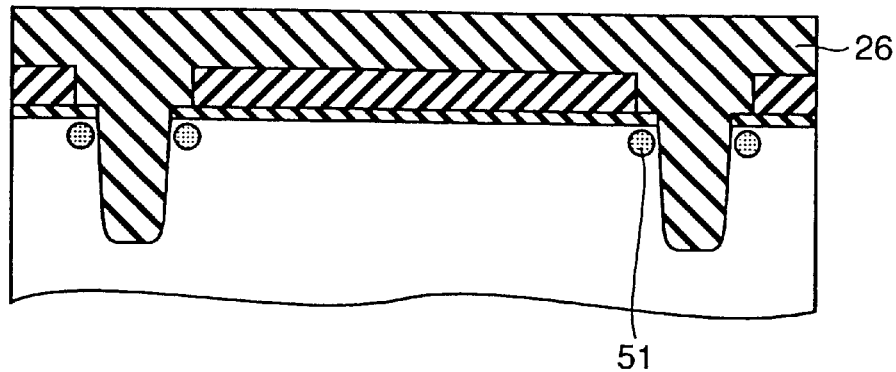

Referring to FIG. 38, an oxide film 26 (TEOS or HDP-CVD, for example) is used to fill in trench 23.

Figure 39:
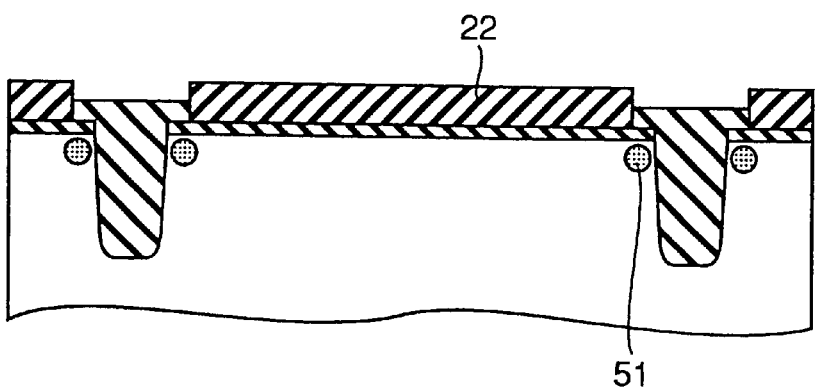

Referring to FIGS. 38 and 39, using silicon nitride film 22 as a stopper, the thickness of oxide film 26 is reduced by a planarization method (such as etching and chemical mechanical polishing) till the surface of silicon nitride film 22 is exposed. Then, silicon nitride film 22 exposed by planarization is removed. Furthermore, oxide film 21 is removed by wet etching.

Figure 40:
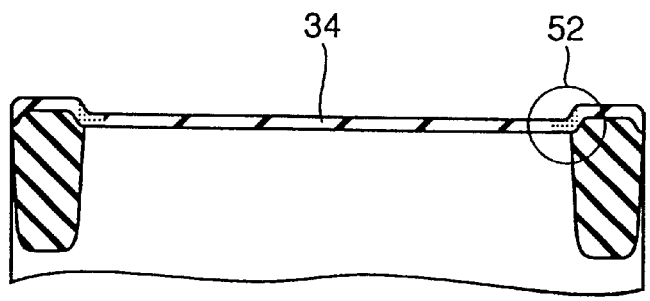

Referring to FIG. 40, a gate insulation film 34 is formed. At this time, ions 50 in implanted region 51 are introduced to the gate insulation film at a channel edge 52, and the gate insulation film at channel edge 52 comes to have a lower dielectric constant than gate insulation film 30 at the center.

Figure 41:
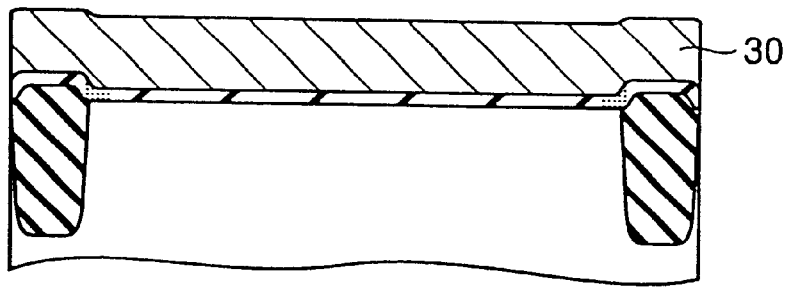

Referring to FIG. 41, a gate electrode 30 is formed thereby completing a gate structure.

Because of the ions (fluorine or carbon, for example), having the effect of decreasing the dielectric constant, previously implanted during gate oxide film formation, the dielectric constant of the oxide film at the isolation edge becomes lower than that of the channel central portion. Thus, the electric field at the isolation edge (channel edge) becomes lower as compared with the channel central portion, which eases electric field concentration at the isolation edge. It can prevent decrease in the threshold and increase in the leakage current of an MOSFET and can realize superior transistor properties.

SEVENTH EXAMPLE

Figure 42:
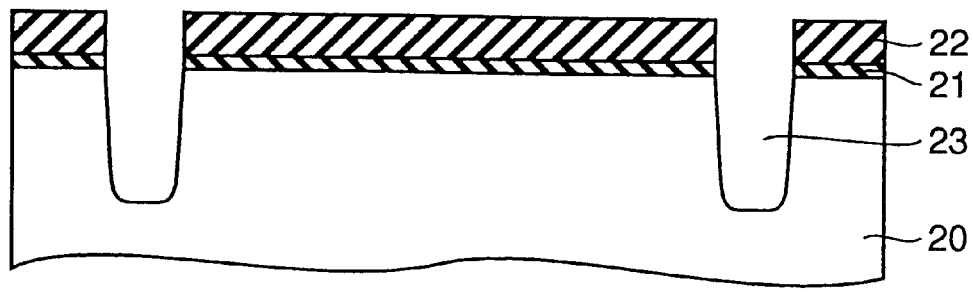
FIGS. 42 to 47 are sectional views of a semiconductor device in first to sixth steps of a semiconductor device manufacturing method according to a seventh example.

Referring to FIG. 42, a pattern of a thermal oxide film 21 and a silicon nitride film 22 is formed on a silicon substrate 20 similarly to conventional examples. A portion without the pattern is intended to isolate MOSFETs (active elements). The opening portion (isolation portion) is formed such as by photolithography and dry etching. In other words, the pattern is removed at a portion for forming an isolation region and is left at a portion for forming an electronic element. The film thickness of thermal oxide film 21 and silicon nitride film 22 is sufficient if they are not disappeared by subsequent processes (such as trench formation and planarization). The film thickness is approximately 100 nm or more in total. The extension of the opening portion (separation width on a mask) depends on a circuit type. It may be from 0.1 μm to several hundreds μm in the same wafer. Then, by using silicon nitride film 22 as a mask, silicon substrate 20 is selectively etched to form a trench 23. The depth of trench 23 depends on selection of the minimum isolation width and is approximately 0.3 μm or less in a small integrated circuit of 0.14 μm or less.

Figure 43:
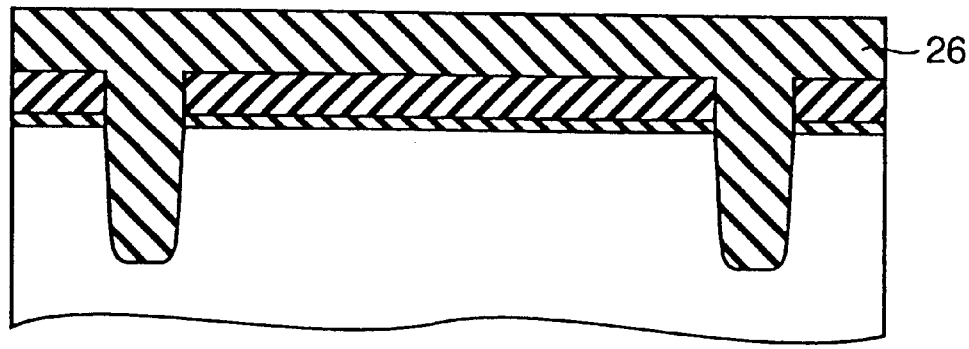

Referring to FIG. 43, an oxide film 26 (TEOS or HDP-CVD, for example) is used to fill in trench 23.

Figure 44:
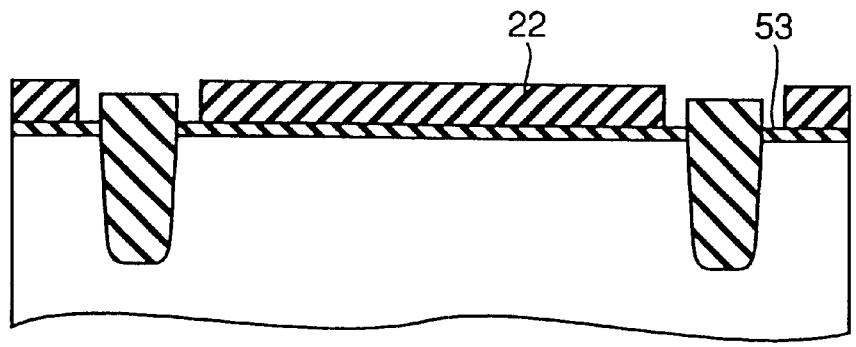

Referring to FIGS. 43 and 44, using silicon nitride film 22 as a stopper, the thickness of oxide film 26 is reduced by a planarization method (such as etching and chemical mechanical polishing) till the surface of silicon nitride film 22 is exposed. The next is the process as a point of the present invention.

Referring to FIG. 44, silicon nitride film 22 is etched and receded horizontally from the end of trench 23 to expose part 53 of the surface of oxide film 21.

Figure 45:
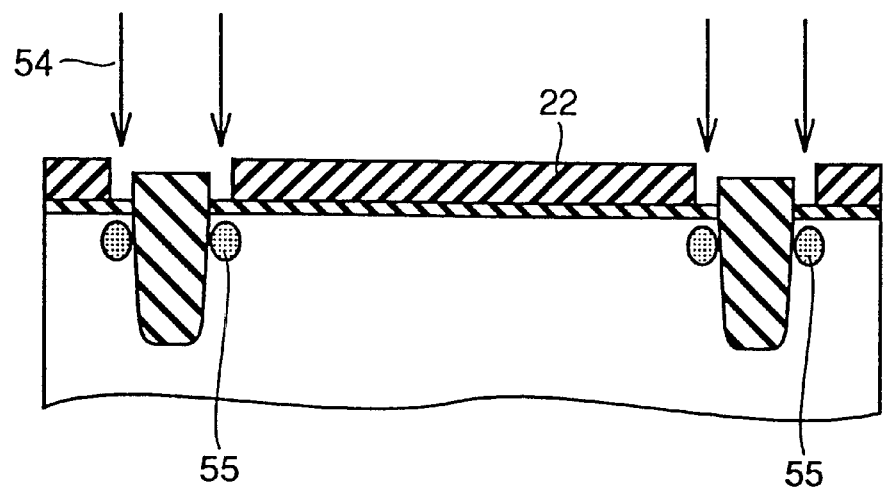

Referring to FIG. 45, ions 54 (fluorine or carbon, for example) for decreasing the dielectric constant of an isolation film are implanted almost orthogonally into silicon substrate 27 to form an implanted region 55. The implantation position is such that the ions arrive near the surface of silicon substrate 20. Since a region for element formation is covered by silicon nitride film 22 at this time, ion implantation is not carried out in the region.

Then, silicon nitride film 22 is removed. Furthermore, oxide film 21 is removed by wet etching.

Figure 46:
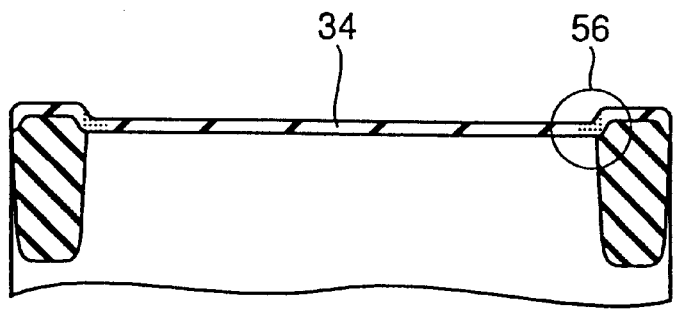

Referring to FIG. 46, a gate insulation film 34 is formed. At this time, ions 54 in implanted region 55 are introduced to a gate insulation film 56 at a channel edge, and therefore gate insulation film 56 at the channel edge comes to have a lower dielectric constant than that of gate insulation film 34 at the center.

Figure 47:
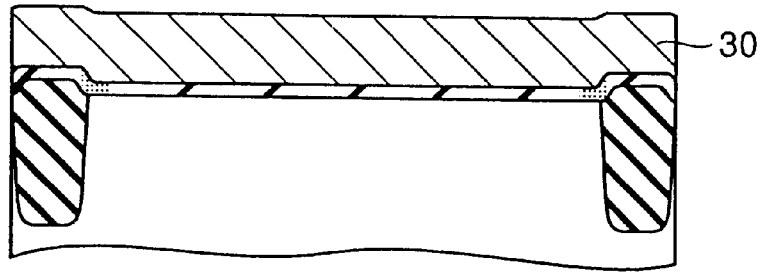
Figure 48:
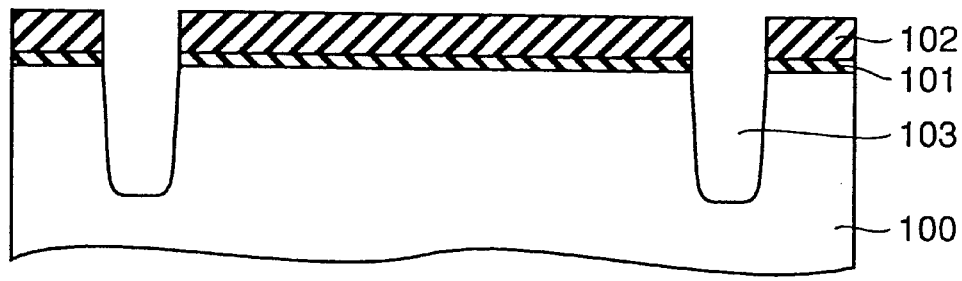
FIGS. 48 to 52 are sectional views of a semiconductor device in first to fifth steps of a conventional semiconductor device manufacturing method.
Figure 49:
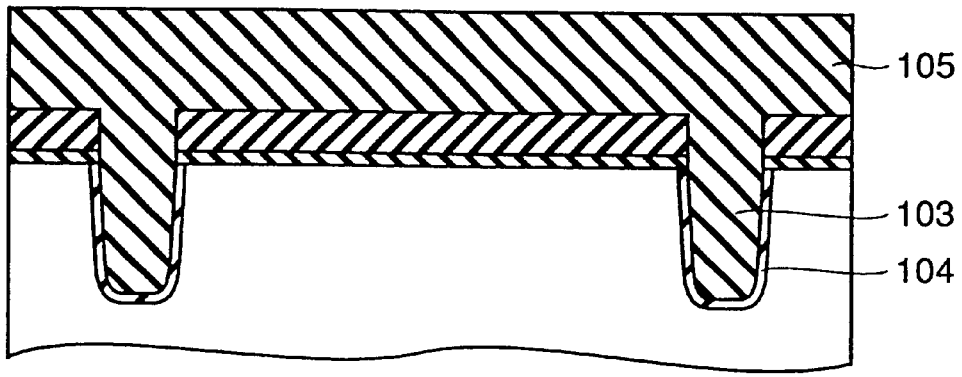
Figure 50:
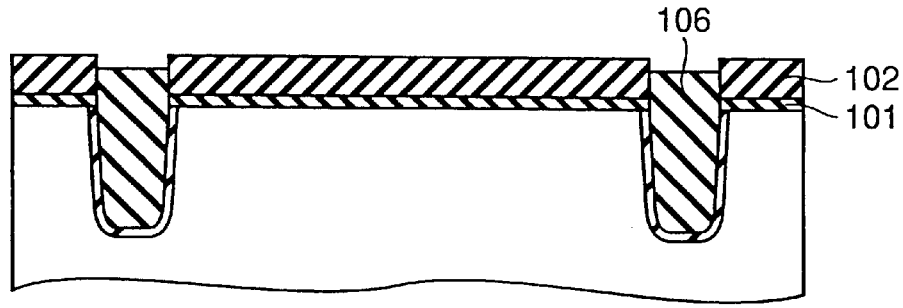
Figure 51:
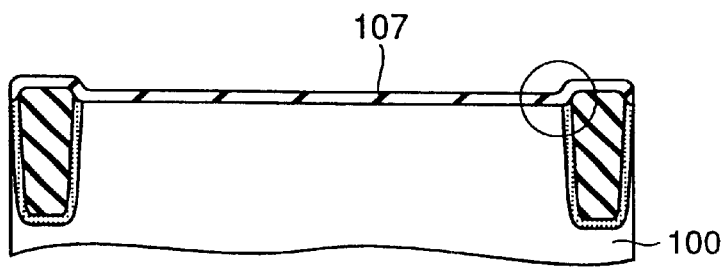
Figure 52:
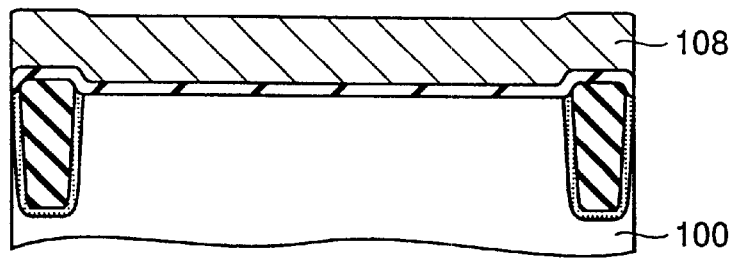
Figure 53:
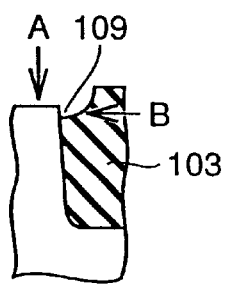
FIG. 53 shows problems with the conventional semiconductor device manufacturing method.

Referring to FIG. 47, a gate electrode 30 is formed on silicon substrate 20 thereby completing a gate structure.

Because of the ions, having the effect of decreasing the dielectric constant, previously implanted during gate oxide film formation, the dielectric constant of the oxide film at the isolation edge becomes lower than that of the channel central portion. Thus, the electric field at the isolation edge (channel edge) becomes lower as compared with the channel central portion, which eases electric field concentration at the isolation edge. It can prevent decrease in the threshold and increase in the leakage current of an MOSFET and can realize superior transistor properties.

EIGHTH EXAMPLE

In the first, second and third examples, a thermal oxide film is mainly used as the gate insulation film. However, the present invention is not limited to the case. The similar effects can be attained even by using an isolation film of a nitride film type as a gate insulation film. It is preferable in this case to determine a material so as to increase the dielectric constant it of the gate insulation film itself. By making the isolation edge an insulation film of a low dielectric constant in this case, the gate electric field at the isolation edge can be reduced more effectively.

As described above, according to the present invention, the dielectric constant in the channel direction is not.uniform in the gate insulation film of transistor. Therefore, the gate electric field concentration at the channel edge (isolation edge) can be reduced and the operation of a parasitic MOS can be suppressed, which can reduce the leakage current. Since the gate electric field at the isolation edge can be weakened even if the isolation edge is depressed, the transistor properties are not affected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   a gate insulation film formed on said semiconductor substrate;
   a gate electrode formed on said semiconductor substrate with said gate insulation film therebetween; and
   a trench isolation film formed on said semiconductor substrate and contacting an edge portion of said gate insulation film, wherein said trench isolation film has a depression, and the dielectric constant of the gate insulation film in a neighborhood of said depression is lower than the dielectric constant of the gate insulation film at other portions of said gate insulation film.

2. A semiconductor device, comprising:
   a semiconductor substrate;
   a gate insulation film formed on said semiconductor substrate, said gate insulation film including a single material having a first end, a second end, and a central region extending from said first end to said second end in a channel width direction; and
   a gate electrode formed on said semiconductor substrate with said gate insulation film therebetween,
   said first end and second end having a first and second dielectric constant, respectively, and said central region having a third uniform dielectric constant different from said first and second dielectric constant; and
   a trench isolation film formed on said semiconductor substrate and contacting said gate insulation film, said trench isolation film having a depression, and wherein the dielectric constant of the gate insulation film in a neighborhood of said depression is lower than the dielectric constant of the gate insulation film at other portions of said gate insulation film.

3. A semiconductor device, comprising:
   a semiconductor substrate;
   a gate insulation film formed on said semiconductor substrate; and
   a gate electrode formed on said semiconductor substrate with said gate insulation film therebetween,
   said gate insulation film having a dielectric constant not uniform in its surface,
   a trench isolation film formed on said semiconductor substrate and contacting an edge portion of said gate insulation film, said trench isolation film having a depression, and wherein the dielectric constant of the gate insulation film in a neighborhood of said depression is lower than the dielectric constant of the gate insulation film at other portions of said gate insulation film.

4. The semiconductor device according to claim 1, wherein the dielectric constant of a channel central region of said gate insulation film is made higher than 3.9.

5. The semiconductor device according to claim 1, wherein a channel edge, in a channel width direction, of said gate insulation film includes F or C.

6. The semiconductor device according to claim 1, wherein a channel central region of said gate insulation film includes N.

7. The semiconductor device according to claim 1, wherein said gate insulation film is formed of $Ta_2O_5$ or (Ba, Sr) $TiO_3$.

8. The semiconductor device according to claim 1, wherein said gate insulation film is formed from a single material.

9. A semiconductor device including a trench isolation film surrounding an active region, comprising:
   a semiconductor substrate including said active region;
   a gate insulation film formed on said active region so that a peripheral portion thereof is in contact with said trench isolation film; and
   a gate electrode formed on said semiconductor substrate with said gate insulation film therebetween,
   said trench isolation film having a downward depression formed at an isolation edge of said trench isolation film,
   wherein said trench isolation film has a depression, and wherein the dielectric constant of the gate insulation film in a neighborhood of said depression is lower than the dielectric constant of the gate insulation film at other portions of said gate insulation film.

10. The semiconductor device according to claim 9, wherein the dielectric constant of a region of said gate insulation film immediately below said gate electrode is made higher than 3.9.

11. The semiconductor device according to claim 9, wherein said portion of said gate insulation film in contact with said depression of said trench isolation film includes F or C.

12. The semiconductor device according to claim 9, wherein said region of said gate insulation film immediately below said gate electrode includes N.

13. The semiconductor device according to claim 9, wherein said gate insulation film is formed of $Ta_2O_5$ or (Ba, Sr) $TiO_3$.

14. The semiconductor device according to claim 1, wherein the dielectric constant of said gate insulation film increases from said edge portion to the central portion of said gate insulation film in a channel width direction.

15. The semiconductor device according to claim 1, wherein said gate insulation film covers at least a portion of said trench isolation film.

16. The semiconductor device according to claim 9, wherein said gate insulation film covers at least a portion of said trench isolation film.

17. The semiconductor device according to claim 2, wherein said gate insulation film is formed exclusively from said single material.

18. The semiconductor device according to claim 8, wherein said gate insulation film is formed exclusively from said single material.

* * * * *